(12) United States Patent
Spiro

(10) Patent No.: US 10,502,407 B1
(45) Date of Patent: Dec. 10, 2019

(54) HEAT SINK WITH BI-DIRECTIONAL LED LIGHT SOURCE

(71) Applicant: Daniel S. Spiro, Scottsdale, AZ (US)

(72) Inventor: Daniel S. Spiro, Scottsdale, AZ (US)

( * ) Notice: Subject to any disclaimer, the term of this patent is extended or adjusted under 35 U.S.C. 154(b) by 0 days.

(21) Appl. No.: 16/019,329

(22) Filed: Jun. 26, 2018

Related U.S. Application Data

(60) Provisional application No. 62/674,431, filed on May 21, 2018.

(51) Int. Cl.
```
F21V 29/74      (2015.01)
F21V 5/04       (2006.01)
F21Y 115/10     (2016.01)
H01L 33/64      (2010.01)
F21V 15/01      (2006.01)
```

(52) U.S. Cl.
CPC .............. *F21V 29/74* (2015.01); *F21V 5/04* (2013.01); *F21V 15/01* (2013.01); *F21Y 2115/10* (2016.08); *H01L 33/642* (2013.01)

(58) Field of Classification Search
CPC ........ F21V 15/01; F21V 19/008; F21V 29/74; F21Y 2115/10
See application file for complete search history.

(56) References Cited

U.S. PATENT DOCUMENTS

| | | | | |
|---|---|---|---|---|
| 6,428,183 B1 * | 8/2002 | McAlpin | .................. | F21S 8/06 362/147 |
| 7,959,319 B2 * | 6/2011 | Chien | .................... | F21S 8/031 362/218 |
| 8,246,209 B2 * | 8/2012 | Lai | .......................... | F21S 10/00 362/269 |
| 9,267,650 B2 * | 2/2016 | Simon | ....................... | F21K 9/27 |
| 9,574,717 B2 * | 2/2017 | Scapa | ................... | F21V 23/006 |
| 9,644,800 B2 * | 5/2017 | Purdy | ....................... | F21K 9/60 |
| 9,846,272 B2 * | 12/2017 | Dau | ..................... | G02B 6/0073 |
| 10,047,943 B2 * | 8/2018 | Storey | ..................... | F21V 29/56 |
| 10,125,946 B2 * | 11/2018 | Meerbeek | ............... | F21S 8/033 |
| 2008/0314944 A1 * | 12/2008 | Tsai | ........................ | F21S 2/005 224/331 |
| 2009/0190350 A1 * | 7/2009 | Tseng | ..................... | F21S 2/005 362/249.01 |
| 2010/0002426 A1 * | 1/2010 | Wu | ....................... | F21V 7/0016 362/223 |
| 2010/0301773 A1 * | 12/2010 | Chemel | ................ | H05B 37/029 315/297 |
| 2011/0075416 A1 * | 3/2011 | Chou | ........................ | F21K 9/00 362/235 |

(Continued)

*Primary Examiner* — Robert J May
*Assistant Examiner* — Leah Simone Macchiarolo
(74) *Attorney, Agent, or Firm* — Schmeiser, Olsen & Watts, LLP

(57) ABSTRACT

A heat sink with bi-directional LED light source is provided. The heat seat includes a plurality of LED light sources mountable to top and bottom surfaces of the heat sink. The heat sink further includes a partial or through bore extending from one end of the heat sink to the other. The through bore contains power or power and data conductors between fluorescent receptacle end caps. The heat sink may include integral heat dissipating fins extending outwardly from at least one of the said heat sink sides. Light emitted from the plurality of light sources is redirected using lens optics to illuminate at least one surface above or below the heat sink.

26 Claims, 13 Drawing Sheets

(56) References Cited

U.S. PATENT DOCUMENTS

| | | | |
|---|---|---|---|
| 2011/0141723 A1* | 6/2011 | Lai | F21V 19/0045 |
| | | | 362/218 |
| 2011/0141724 A1* | 6/2011 | Erion | F21V 23/009 |
| | | | 362/218 |
| 2011/0235318 A1* | 9/2011 | Simon | F21V 7/0008 |
| | | | 362/217.05 |
| 2011/0286208 A1* | 11/2011 | Chen | F21V 21/30 |
| | | | 362/217.1 |
| 2012/0212953 A1* | 8/2012 | Bloom | H05B 33/089 |
| | | | 362/223 |
| 2013/0039041 A1* | 2/2013 | Yeh | F21S 8/04 |
| | | | 362/147 |
| 2013/0050998 A1* | 2/2013 | Chu | F21V 7/0008 |
| | | | 362/218 |
| 2013/0119896 A1* | 5/2013 | Fukano | H01R 13/7175 |
| | | | 315/312 |
| 2014/0126190 A1* | 5/2014 | Dixon | F21L 4/00 |
| | | | 362/190 |
| 2015/0211710 A1* | 7/2015 | Speier | F21S 8/04 |
| | | | 362/606 |
| 2015/0300617 A1* | 10/2015 | Katona | F21S 8/06 |
| | | | 362/147 |
| 2015/0345743 A1* | 12/2015 | Trincia | F21V 7/0091 |
| | | | 362/223 |
| 2017/0254493 A1* | 9/2017 | Giorgini | F21K 9/278 |

* cited by examiner

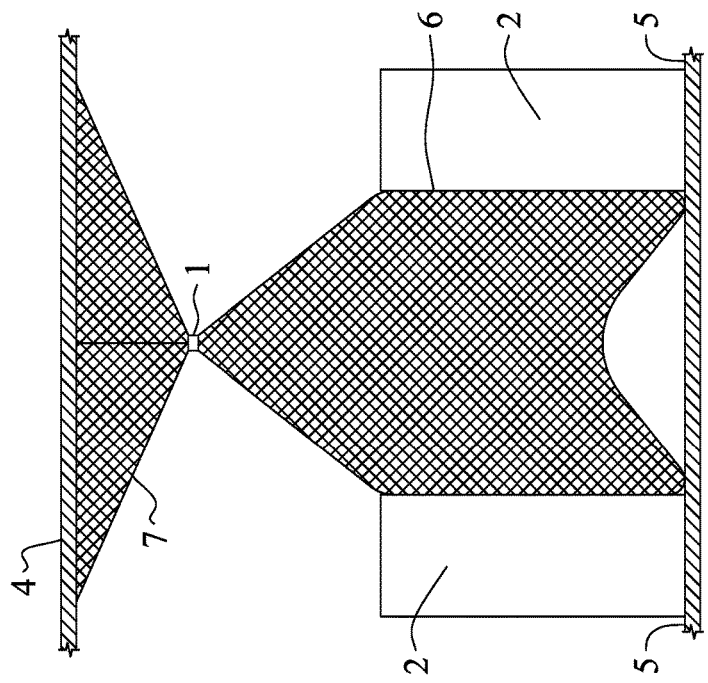
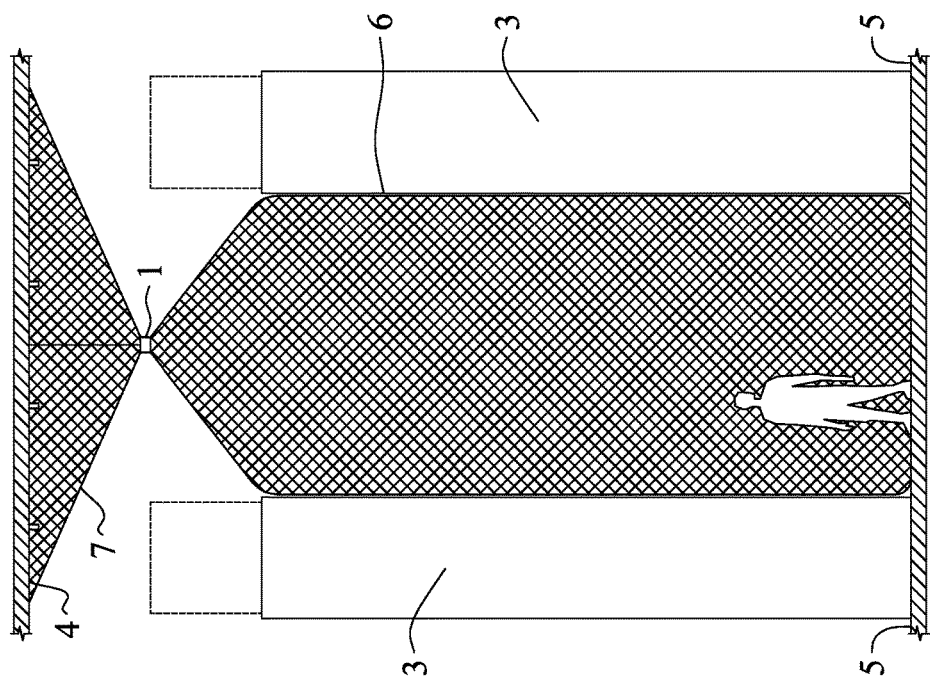

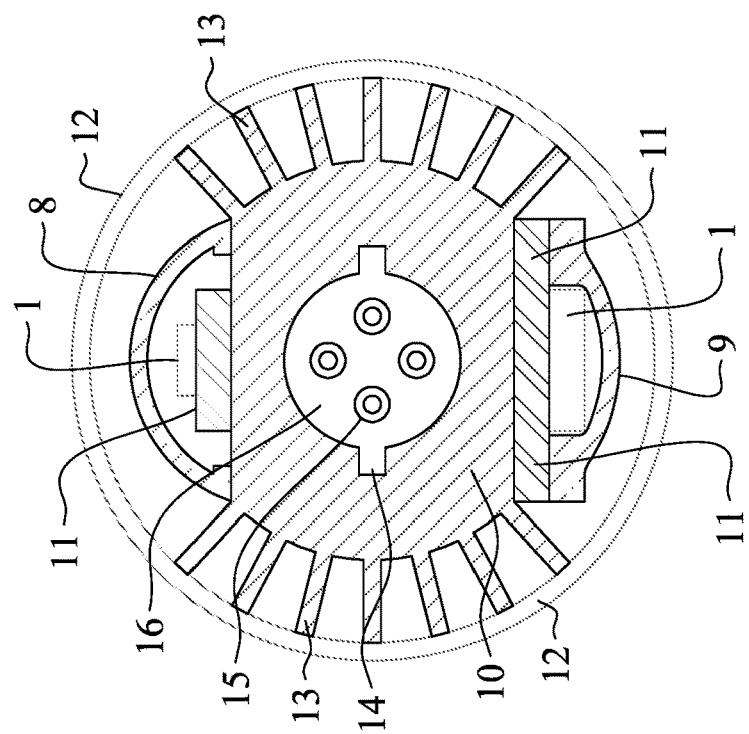
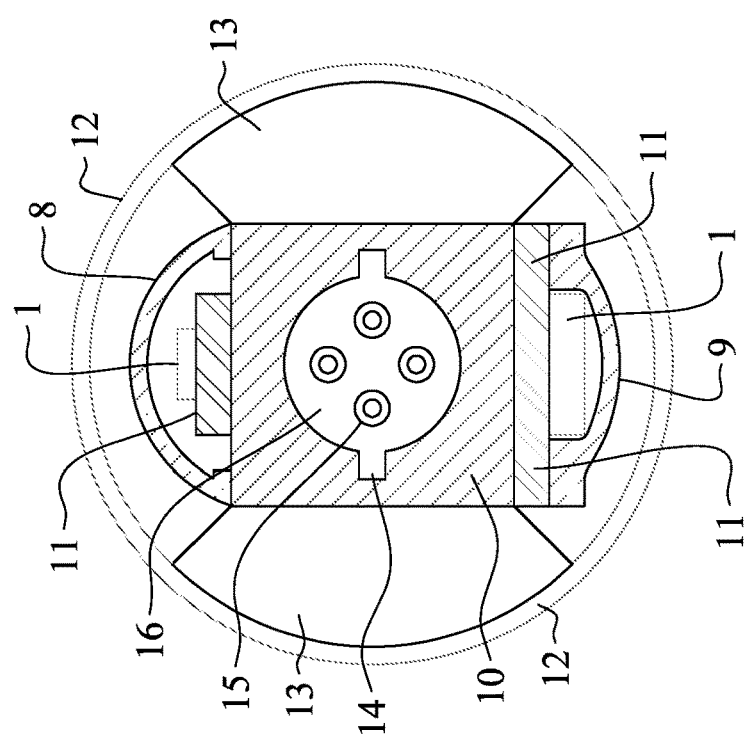
FIG. 2B
FIG. 2A

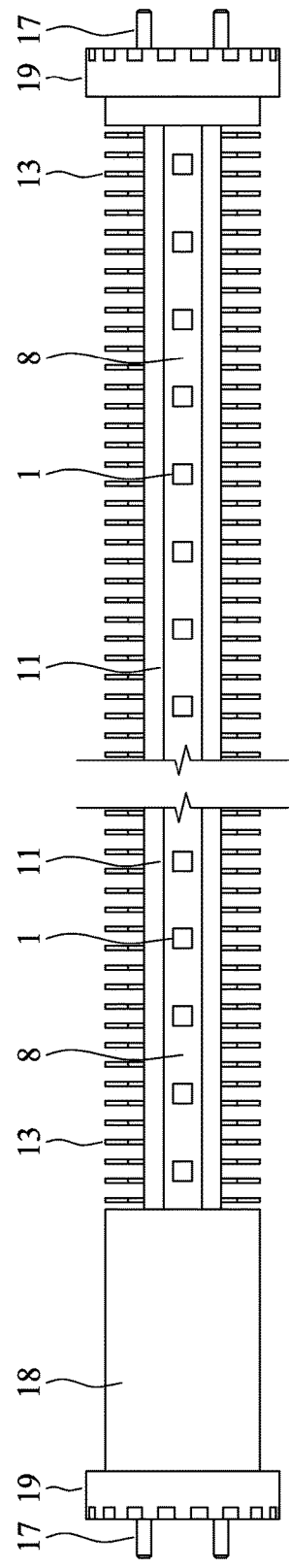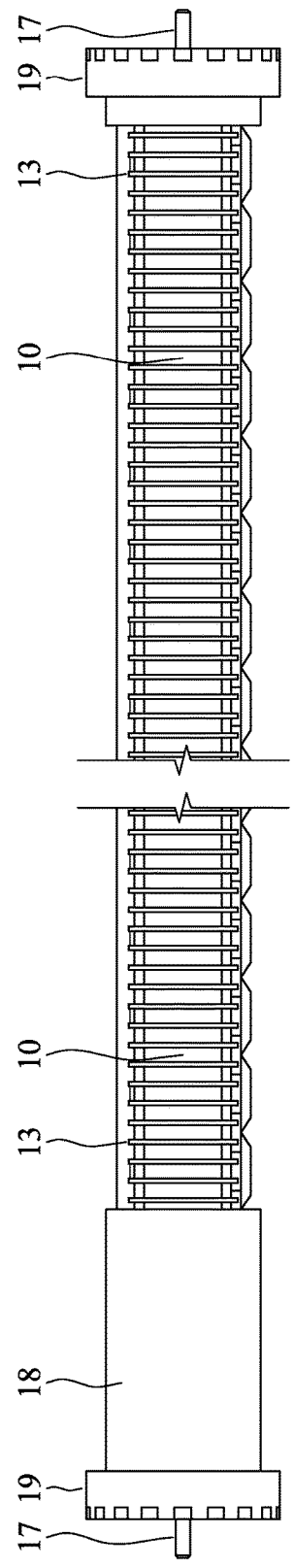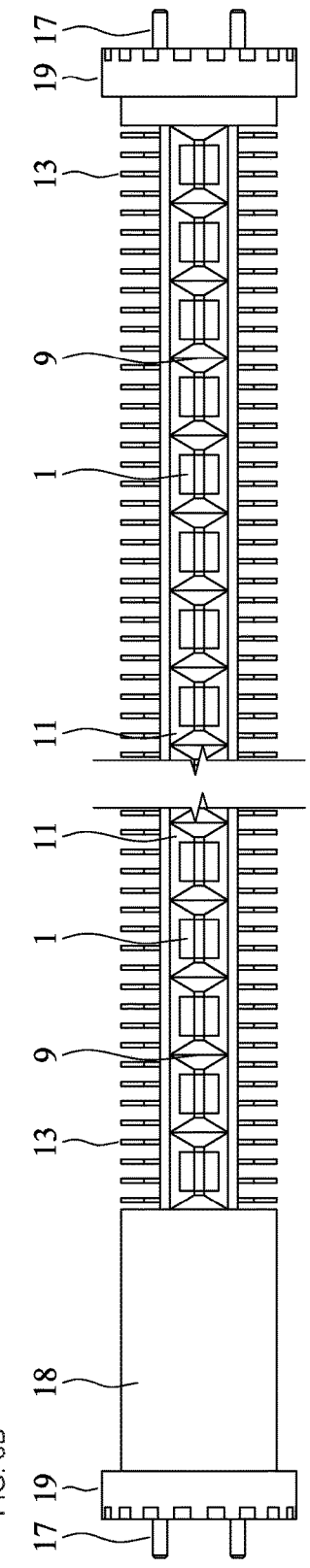

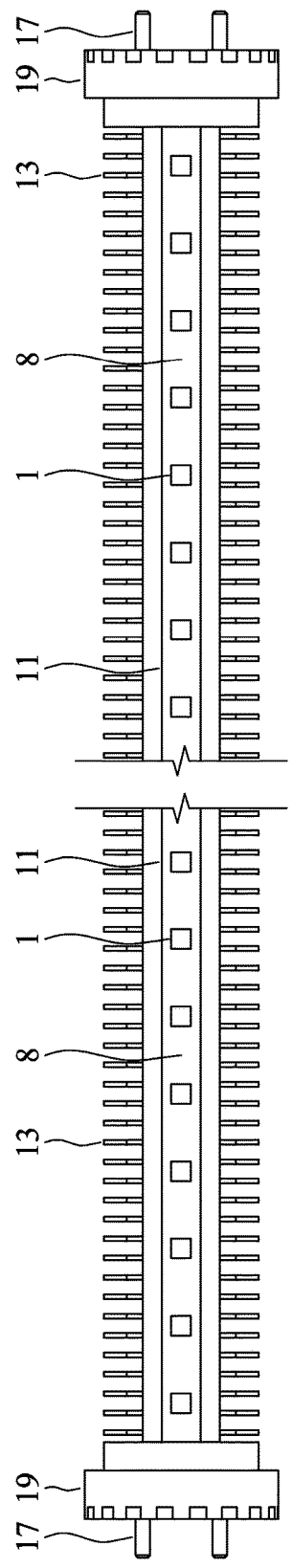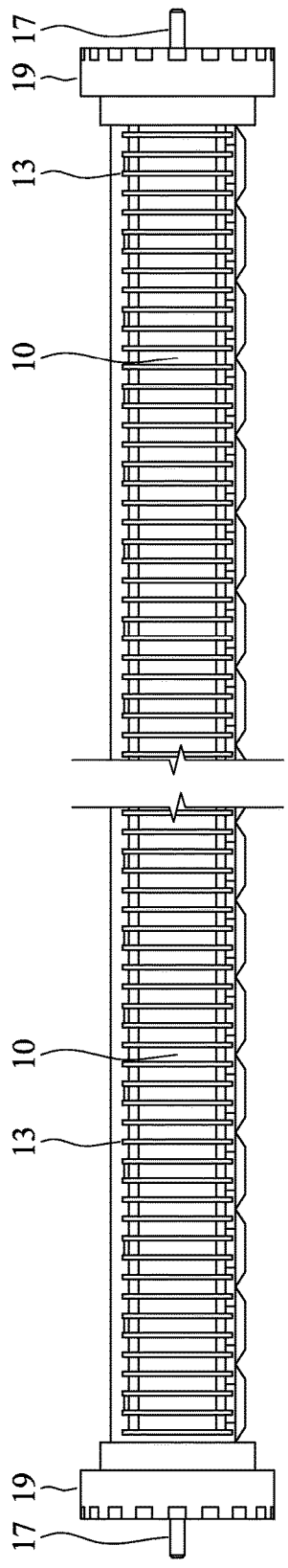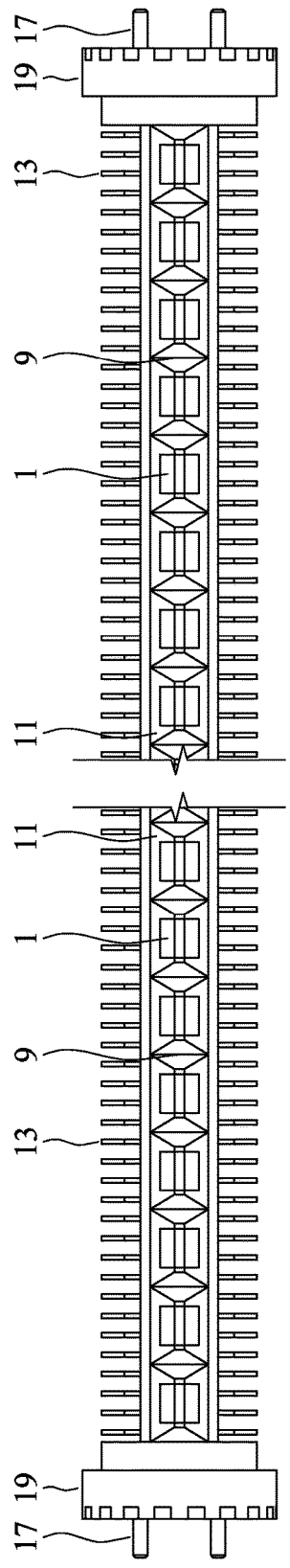

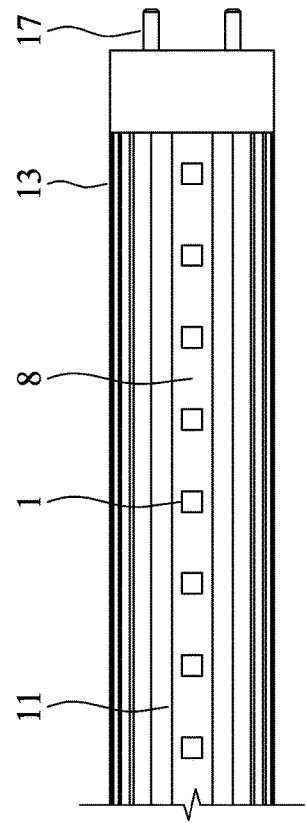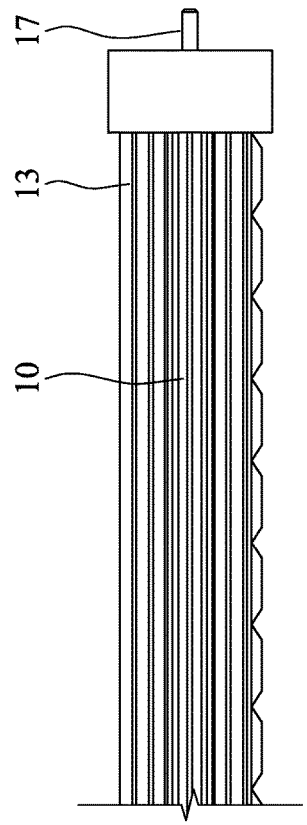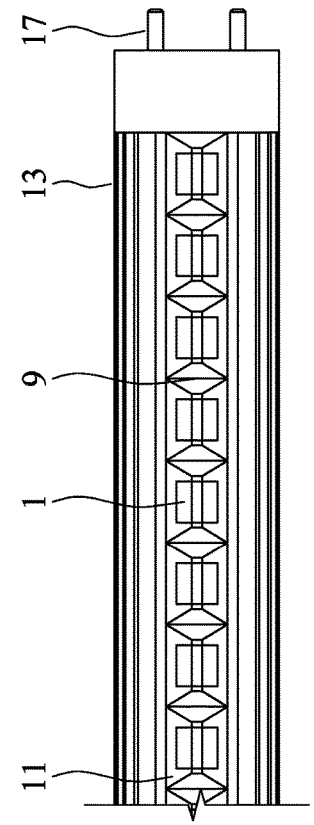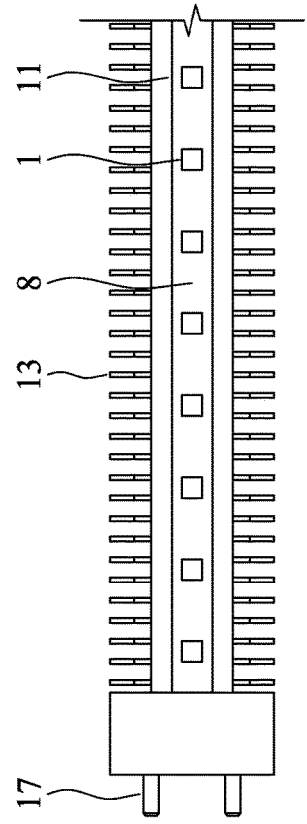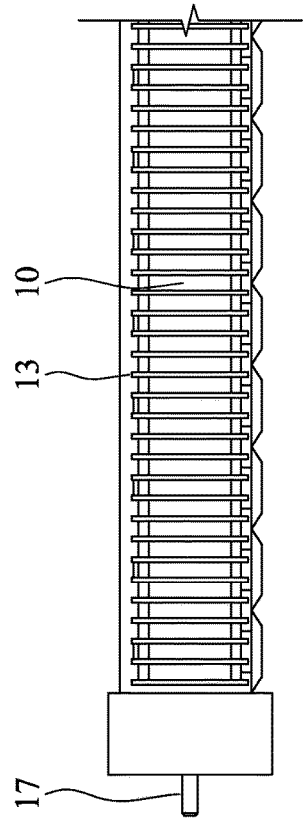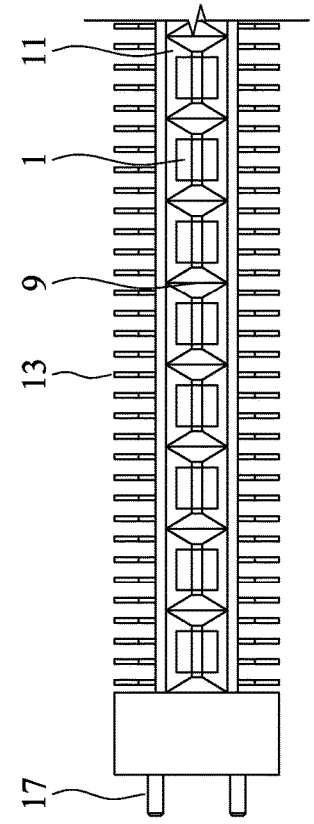

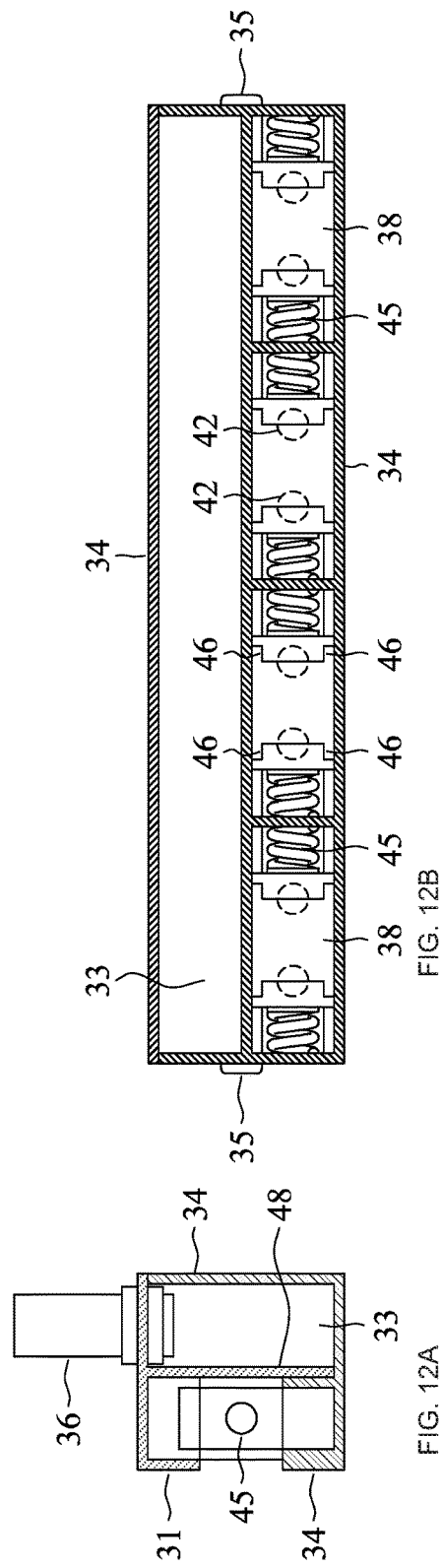

HEAT SINK WITH BI-DIRECTIONAL LED LIGHT SOURCE

BACKGROUND OF THE INVENTION

Technical Field

This invention relates generally to a light source and more particularly to a heat sink with a single or bi-directional LED light source.

State of the Art

Today, LED lamp technology is replacing dated fluorescent lamp technology. The replacement takes form by retrofitting existing luminaires and installing new luminaires.

The fluorescent lamp generates light by spanning an electrical arc between the lamp's cathodes. The lamp's cathodes are fixed to the lamp's ends receiving power from the lamp holders. The arc excites the phosphorus coating inside the inner perimeter of the lamp's tube, causing the Phosphorus to glow and emit visible light. The light emitted from the fluorescent lamp radiates evenly at 360 degrees across the lamp' diameter. Fluorescent lamps' output varies at different temperatures. In cold environments, the lamp output diminishes. In warm environments, the lamp output peaks at a specific temperature based on lamp type. Temperatures exceeding this threshold point will contribute to lamp output degradation and premature lamp failure. In spaces where fluorescent luminaires are suspended from the ceiling, manufacturers fabricate an opening directly above the lamp to enable the heat generated to vent up and away. A residual result is upwardly light bleed which architects and interior designers employ as a means to illuminate the ceiling eliminating the visually unpleasant "cave effect".

SUMMARY OF THE INVENTION

The present invention relates to a heat sink with single or bi-directional LED sources.

The LED lamp is a planar light source emitting light in a directional pattern. Most LED lamp modules emit their light at a sixty-degree cone from the light module center axis. The LED light source output is also affected by temperature. Published performance data is measured at a laboratory temperature of 25° C. The LED lamp output increases as the temperature is reduced from the tested lamp laboratory condition, and increases as the temperature rises above the laboratory lamp peak temperature. As with all electronic devices, keeping the LED lamp running cool is essential for higher efficiency and longer life. To keep the LED lamp cool, the lamp's module is mounted to a heat sink. The heat sink absorbs the heat generated by the lamp and transfers it to integral fins typically located at the heat sink's outer perimeter. The fins then dissipate the heat into the air. The heat sink with its integral fins can be made of metallic, non-metallic or a combination of both materials. The heat sink can be made employing several fabrication methods including extrusion and molding. Another method that is becoming feasible is 3D printing. The metallic material commonly used is aluminum or aluminum alloy and the non-metallic is heat-dissipating material such as a polymer. As LED light sources replace dated fluorescent lamp technology, owners of existing fluorescent luminaires look for economical means to convert their luminaires to LED lamp technology.

Legend

| | | |
|---|---|---|
| 1. Lamp source | 21. Rotation device locking hub | 37. Power or power/data receptacle |
| 2. Display shelves | 22. Lamp's driver or driver and other device(s) enclosure | 38. Heat sink core port |
| 3. Rack | | 39. Knockout opening |
| 4. Ceiling | | |
| 5. Floor | | |
| 6. Narrow light dispersion pattern | 23. Lamp power outer contact disk | 40. Cable or chain hanging opening |
| 7. Wide light dispersion pattern | 24. Driver bore connection | 41. Anchoring protrusion |
| 8. Lens clear or frosted | 25. Lamp power inner contact disk | 42. Self-retaining heat sink cavity |
| 9. Nano optics lens | 26. Lamp pin beyond | 43. Sink core |
| 10. Heat sink | 27. Lamp pin leads | 44. Receiving receptacle |
| 11. Lamp die | 28. Rotation device hub key | |
| 12. End cap receptacle | | 45. Spring-loaded ball or pin |
| 13. Fins | 29. End cap receptacle key | |
| 14. Mechanical Key | | 46. Heat sink retaining track(s) |
| 15. Conductor(s) | 30. End cap receptacle exterior elevation | |
| 16. Bore | | 47. Power or power and data entry |
| 17. Lamp electrical pin(s) | 31. Retainer housing | |
| | 32. Retainer housing body | 48. Housing division wall |
| 18. Lamp's driver or driver and other devices | 33. J Box | 49. Occupancy sensor |
| 19. Lamp rotation device | 34. J Box cover | |
| | 35. Release button/latch | 50. Sink retaining plunger |
| 20. Rotation device fixed key | 36. Ridged conduit | |

The foregoing and other features and advantages of the present invention will be apparent from the following more detailed description of the particular embodiments of the invention, as illustrated in the accompanying drawings.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1A depicts a side view of a partial building section highlighting the illumination dispersion pattern of the heat sink with single or bi-directional lamps according to an embodiment;

FIG. 1B depicts a side view of another partial building section highlighting the illumination dispersion pattern of the heat sink with single or bi-directional lamps according to an embodiment;

FIG. 2A is a cross-sectional view of the heat sink with single or bi-directional lamps according to an embodiment;

FIG. 2B is a cross-sectional view of the heat sink with single or bi-directional lamps according to an embodiment;

FIG. 3A is a partial top view of the heat sink with single or bi-directional lamps and an integral driver or driver and other device(s) with heat-dissipating fins perpendicular to the long axis according to an embodiment;

FIG. 3B is a partial side view of the heat sink with single or bi-directional lamps and an integral driver or driver and other device(s) with heat-dissipating fins perpendicular to the long axis according to an embodiment;

FIG. 3C is a partial bottom view of the heat sink with single or bi-directional lamps and an integral driver or driver and other device(s) with heat-dissipating fins perpendicular to the long axis according to an embodiment;

FIG. 5A is a top view of the heat sink with single or bi-directional lamps embodiment and heat-dissipating fins perpendicular to the long axis according to an embodiment;

FIG. 5B is a side view of the heat sink with single or bi-directional lamps embodiment and heat-dissipating fins perpendicular to the long axis according to an embodiment;

FIG. 5C is a bottom view of the heat sink with single or bi-directional lamps embodiment and heat-dissipating fins perpendicular to the long axis according to an embodiment;

FIG. 7A is a top view of the heat sink with single or bi-directional lamps embodiment, perpendicular heat-dissipating fins and conventional bi-pin end cap receptacle according to an embodiment;

FIG. 7B is a side view of the heat sink with single or bi-directional lamps embodiment, perpendicular heat-dissipating fins and conventional bi-pin end cap receptacle according to an embodiment;

FIG. 7C is a bottom view of the heat sink with single or bi-directional lamps embodiment, perpendicular heat-dissipating fins and conventional bi-pin end cap receptacle according to an embodiment;

FIG. 7D is a top view of the heat sink with single or bi-directional lamps embodiment, parallel heat-dissipating fins and conventional bi-pin end cap receptacle according to an embodiment;

FIG. 7E is a side view of the heat sink with single or bi-directional lamps embodiment, parallel heat-dissipating fins and conventional bi-pin end cap receptacle according to an embodiment;

FIG. 7F is a bottom view of the heat sink with single or bi-directional lamps embodiment, parallel heat-dissipating fins and conventional bi-pin end cap receptacle according to an embodiment;

FIG. 12A is a section view of a retainer housing according to an embodiment;

FIG. 12B is another section view of a retainer housing according to an embodiment;

FIG. 13A is a bottom exploded perspective view a retainer housing and heat sink according to an embodiment.

DETAILED DESCRIPTION OF EMBODIMENTS OF THE INVENTION

Figure 4A:
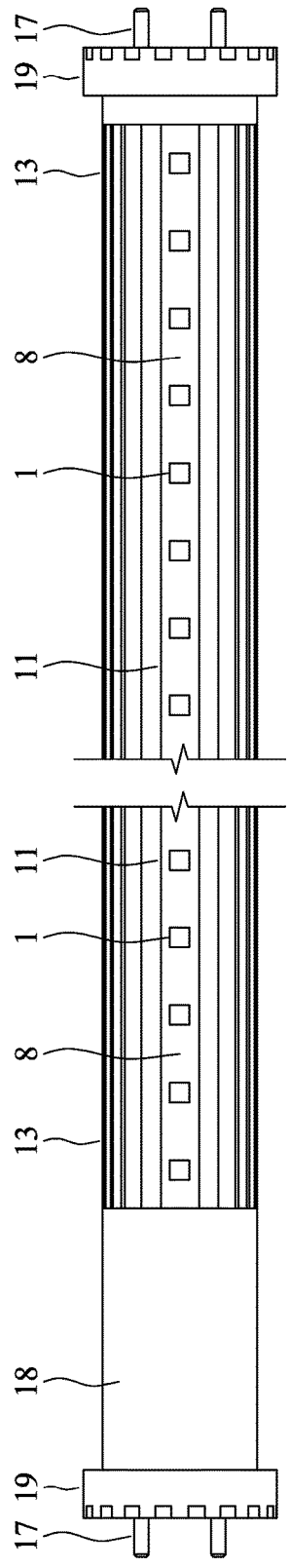
FIG. 4A is a top view of the heat sink with single or bi-directional lamps embodiment and an integral driver or driver and other device(s) with heat-dissipating fins parallel to the long axis according to an embodiment.

As discussed above, embodiments of the present invention relate to a heat sink with a bi-directional LED source.

Problem Definition

Over the last three decades, industrial and commercial buildings have employed large numbers of fluorescent luminaires to replace HID luminaires. These luminaires are typically powered by electronic ballasts and employ a variety of tubular fluorescent lamps. Among these luminaires, many are ceiling-suspended having openings inside the luminaire housing above the lamp. The openings' purpose is to vent hot air generated by the lamp or the lamp and ballast. The opening also allows a small portion of the lamp's light to escape upwardly. This feature is often used by designers as a means to illuminate the ceiling and make the space appear more hospitable. As the lighting industry converts to LED lighting, building owners are looking for:

Maintenance cost reduction
 Energy consumption reduction
 Avoidance of operational disruption
 Enhancement of the space appearance
 Avoidance of costly capital expenditure upgrading to new LED luminaires The innovation disclosed herein provides an LED lamp replacement solution to a fluorescent lamped luminaire as well as a new form of a luminaire. The solution provides for a single or bi-directional lamp illumination, particularly for owners employing ceiling-suspended fluorescent luminaires that use openings to vent hot air generated by lamps and ballasts. This innovation also fundamentally changes luminaire design removing the need for a housing. The heatsink with its lamp modules, specialized optics and at lease in one embodiment integral driver, removes the need to contain the light source inside a housing for structural rigidity.

About the Innovation

Optimal LED lamp performance is dependent on its heat sink's or heat sink's and fins' ability to absorb and transfer the lamp heat away from the lamp and the driver. This innovation's heat sink design supports the use of floor-facing (down) and ceiling-facing (up) LED modules within a single embodiment, having heat-dissipating fins on at least one top or bottom of the heat sink, and power or power and data entry on at least one end of the elongated heat sink body. The heat-dissipating integral fins of the heat sink can extend outwardly parallel or perpendicular to the heat sink's long axis. These fins extend outwardly by at least 10° up and down from the heat sink's horizontal short axis and may be fully exposed to surrounding air and up draft of cooling air from below. Inside the heat sink, an optional through bore enables conductors to connect with electrical end cap receptacles at both ends of the elongated body. The receptacles mechanically or mechanically and electrically engage the lamp holders. Where power or power and data can be supplied only from one end and through bore may not be employed, lamp module connectivity may be accomplished by having the conductors emerge from an end bore or from the inner end of the end cap receptacle and connect to the lamp's module. When integral driver is used, electrical or electrical and data connectivity can be direct from driver to light source die external of the bore. For its up and down light component, the heat sink lamps may employ optical lenses to control the angle of light dispersion perpendicularly to the heat sink's long horizontal axis. By controlling the angle, the light source can be mounted higher while consuming less power. The output ratio of the up and down light component may vary. The output may also be controlled by a step dimmer or full range dimmer. The use of nano optics lenses in controlling LED light dispersion is becoming common practice nowadays for the lighting industry. By contrast, the fluorescent lamp technology typically relied on external reflector optics. The heat sink employing single or bi-directional light sources may be powered by line power, employ an integral or remote driver(s). The light sources can operate jointly or independently of each other in each direction. The light sources may also transmit data using photonic wave frequencies. In addition, the heat sink employing single or bi-directional light sources may include sensing devices capable of communicating by wire, wireless, or a combination thereof. The heat sink with its LED lamps is typically seated into a lamp holder. The lamp holder provides both mechanical and electrical connectivity through engaging pins or other power-conveying receptacles integral to the heat sink's end cap. These receptacles typically conform to the size and material used by the lighting industry; however, they can also be fabricated to operate using a proprietary configuration that may have provisions to convey data. In a different embodiment, the end caps may include a feature that enables the rotation of the heat sink along its center elongated axis. This feature may have a locking device to optimize the LED lamp's orientation, providing the best illumination coverage. In lieu of the rotation device, lamp holders can be replaced with holders having dedicated fixed orientation. The heat sink's profile can vary in form and in size, while employing standard industry end cap receptacles compatible mechanically and electrically with standard industry lamp holders. Appendix A depicts another embodiment, the disclosure of which is incorporated entirely herein by reference. In the other embodiment, as depicted in Appendix A, the heat sink, absent of a housing, replacing the traditional luminaire. The heat sink is made of a rigid body spans between lamp holders. Since the heat sink is made of a rigid body having lamp sources attached to its bottom, top, or both surfaces with optical lenses or lenses and diffusers, the assembly does not need to be contained or housed inside a luminaire. The mechanically self-supported heat sink can be suspended in the air with power, power and data and other devices' connectivity anywhere along the heat sink's span or at the heatsinks' retaining housing. Where higher illumination level is needed, a plurality of heat sinks can be positioned parallel to one another with air gaps between, rigidly connected to a single or double-sided retainer(s) housing. The retainer(s) housing, also made of rigid material, can have position-dedicated lamp holders to maintain proper lamp orientation and mechanical means to provide rigid connectivity between the heat sinks and the retainer(s) housing. The retainer(s) housing with position-dedicated lamp holder can also include driver(s), eliminating the need to house driver(s) inside the heat sink retaining housing. Employing a plurality of heat sinks with the retainer(s) housing forms a structure where the retainer can provide: a mounting location to hang the assembly, power or power and data entry, a mounting structure for sensing and communication devices, and enclosures to contain power or power and data devices. In one embodiment, the end cap retainer(s) lamp holders, also referred herein as the heat sink's core, engage the heat sink with its lamp module source(s) may employ a spring-loaded position dedicated receptacle to allow heat sinks' mobility when they are being placed in position. In another embodiment, the heat sink's core is rigidly connected to the retaining housing. Once in position, mechanical fasteners secure the two elements together, forming a rigid body. The end cap retainer, the heat sink, or both, can be made of metallic or non-metallic material, and can be painted preferable with heat dissipating paint. This product solution removes legacy design elements of traditional luminaires and introduces only essential elements needed to operate current technology luminaires. This innovative, minimalistic design will reduce construction and operation costs. This innovation doesn't require an external housing for the heat sink and the light source modules can be replaced re-using the lens optics or employing new optics.

FIGS. 1a and 1b show partial building cross-sections of spaces where the heat sink with single or bi-directional lamps embodiment are suited for.

FIG. 1a shows a "big box" high rack (3) retail environment like The Home Depot or Lowes stores. The embodiment with its light source (1) is suspended from the ceiling (4). The upwardly-aimed lamp source (4) employs a wide light dispersion pattern (7) lamp to illuminate the ceiling (4). The downwardly lamp source employs a narrow light dispersion pattern (6) optics. This lens is typically Nano optical lens (9) concentrating the light beam pattern to glaze the rack (3) shelves and reach the floor (5) below. By employing the nano optics lens, power is consumed and the heat sink with single or bi-directional lamps embodiment can be high-mounted.

FIG. 1b shows a retail supermarket mid-mounting height as in Safeway and Kroger stores. In this environment, the ceiling (4) is typically covered with acoustical tile. The uplight component of the heat sink with single or bi-directional lamps washes the ceiling creating a uniformly-illuminated white canopy. The lens employed may be clear (8) allowing the light emitted to disperse in its natural 120° dispersion pattern. The downlight component may employ narrow light dispersion patterns (6) that illuminates the display shelves (2) and may reduce the light beam intensity at the middle of the aisle.

FIGS. 2a and 2b show the heat sink with single or bi-directional lamp cross-section.

FIG. 2a shows the heat sink (10) with integral fins (13) extending out from both sides. At its center, a bore (16) may extend from one end to the other of the heat sink (10). Inside the bore (16) power or power and data conductors (15) provide power or power and data to lamp source (1) or lamp source and other devices. Other devices may include sensing and communication devices. Communication method may include wired, wireless, or a combination of both. The fins (13) in this embodiment are perpendicular to the embodiment's long axis. The direction of the fins (10) is typically indicative of moulding manufacturing method. Inside the heat sink's bore (16) a mechanical key (14) connector enables connection with the end cap receptacles (12 not shown) and/or the lamp's driver or driver and other devices (18). Above and below the heat sink (10) LED light source (1) are mounted on lamp die (11). The lamp die's (11) bond to the heat sink (10) is tight to enable quick heat transfer from the lamp source (1) to the heat sink (10). Above the lamp source (1) for up-light component, a wide light dispersion pattern (7) clear or frosted lens (8) typically illuminates the ceiling (4 not shown). For downlight, both the clear or frosted lens (8) is used or the nano optics (9) are used. The Nano optic's (9) narrow light dispersion pattern (6) can be precisely controlled to maximize illumination levels on vertical planes and on the floor while minimizing power consumption. The Nano optic's lens (9) can also be clear or frosted. In the view beyond and around the heat sink (10) assembly is the end cap receptacle (12). The end cap receptacle (12) can be made to conform to the industry standard, or it can employ a lamp rotational device (not shown) which enables lamp rotation to optimize light coverage on the ceiling (4), vertical planes like racks (3), display shelves (2) and horizontal floor surface (5).

FIG. 2b is the same as FIG. 2a with the exception of the heat sink's (10) integral fins (13) orientation. In this embodiment, the fins (13) are positioned parallel to the embodiment's long axis.

FIGS. 3a, 3b and 3c show elevations of the heat sink with integral fins perpendicular to the long axis of the embodiment, single or bi-directional lamp module(s) and an integral driver.

FIG. 3a shows the top elevation of the heat sink's embodiment. The heat sink's fins' (13) orientation is perpendicular to the embodiment's long axis. At one end, the heat sink's embodiment is connected to a lamp driver or driver and other devices enclosure (18) with fluorescent lamp holder end caps pin receptacle (17) enclosing both ends of the heat sink embodiment. In other embodiments, other electrical or electrical and data means of connectivity can be used. In embodiments where the vertical alignment of the bi-directional lamp source (1) is difficult and/or the lamp position cannot be sustained, a lamp rotation device (19) insures proper positioning. This rotation alignment device is explained in more detail in FIGS. 8 and 9. On top of the heat sink, the lamp die (11) with plurality of lamp sources (1) extend from one end of the heat sink to the other. The light source (1) is encased by a clear or frosted lamp lens (8) typically having a wide light dispersion pattern.

FIG. 3b shows the side elevation of the heat sink (10). The other side's elevation typically mirrors this elevation. Elements shown in this elevation include the end caps' lamp pin(s) (17), the lamp rotation device (19), the lamp's driver or driver and other devices enclosure (18), and the heat sink's integral fins (13). These fins are perpendicular to the embodiment's main axis exposing the heat sink (10) to maximum air flow coverage with cool air rising from below and travelling through and in between the fins to above.

FIG. 3c shows the bottom elevation of the heat sink with single or bi-directional lamp sources. Mounted to the bottom of the heat sink (10) is a lamp die (11) with plurality of lamp sources (1). Over the plurality of lamp sources (1), nano optics lens (9) is used to provide a narrow light dispersion pattern across the embodiment's long axis. This and other optical patterns can be used interchangeably with the heat sink for both up and down lighting. Other elements include the lamp's pin(s) (17), the lamp rotation device (19), the lamp's driver or driver and other devices enclosure (18), and the heat sink's fins (13).

Figure 4B:
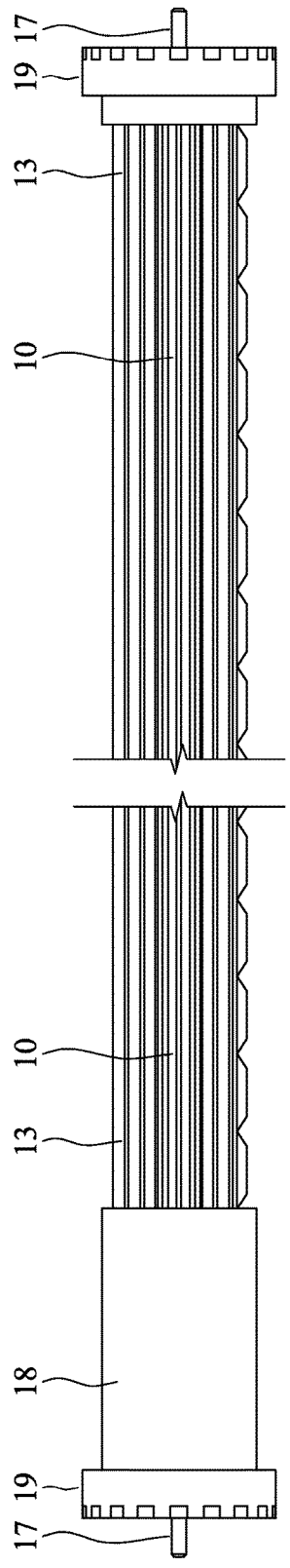
FIG. 4B is a side view of the heat sink with single or bi-directional lamps embodiment and an integral driver or driver and other device(s) with heat-dissipating fins parallel to the long axis according to an embodiment.
Figure 4C:
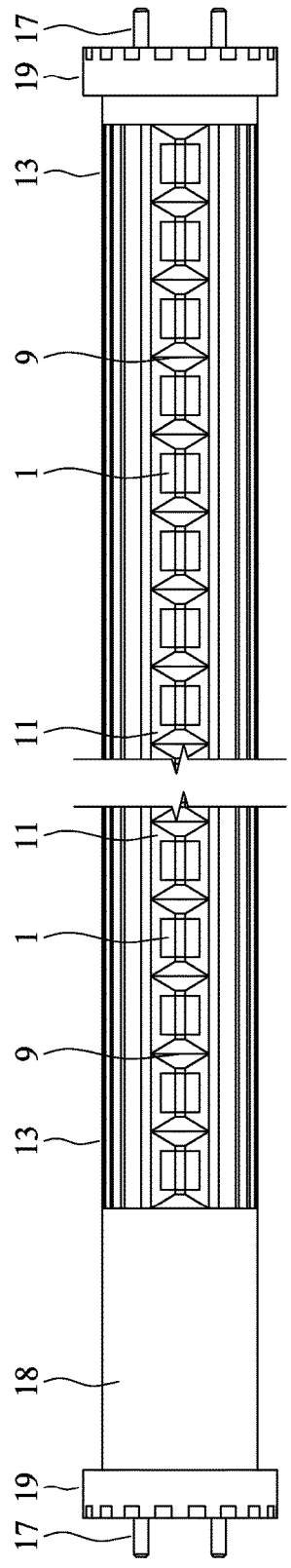
FIG. 4C is a bottom view of the heat sink with single or bi-directional lamps embodiment and an integral driver or driver and other device(s) with heat-dissipating fins parallel to the long axis according to an embodiment.

FIGS. 4a, 4b and 4c show elevations of the heat sink with integral fins parallel to the long axis of the embodiment, single or bi-directional lamp module(s) and an integral driver.

FIG. 4a shows the top elevation of the heat sink's embodiment. The heat sink's fins' (13) are parallel to the embodiment's long axis. At one end, the heat sink's embodiment is connected to a lamp driver or driver and other devices enclosure (18) with fluorescent lamp holder end caps pin receptacle (17) enclosing both ends of the heat sink embodiment. In other embodiments, other electrical or electrical and data means of connectivity can be used. In embodiments where the vertical alignment of the single or bi-directional lamp source (1) is difficult and/or the lamp position cannot be sustained, a lamp rotation device (19) insures proper positioning. This rotation alignment device is explained in more detail in FIGS. 8 and 9. On top of the heat sink, the lamp die (11) with plurality of lamp sources (1) extend from one end of the heat sink to the other. The light source (1) is encased by a clear or frosted lamp lens (8) typically having a wide light dispersion pattern.

FIG. 4b shows the side elevation of the heat sink (10). The other side's elevation typically mirrors this elevation. Elements shown in this elevation include the end caps' lamp pin(s) (17), the lamp rotation device (19), the lamp's driver or driver and other devices enclosure (18), and the heat sink's integral fins (13). These fins are parallel to the embodiment's main axis exposing the heat sink's (10) end fins to surrounding air.

FIG. 4c shows the bottom elevation of the heat sink with single or bi-directional lamp sources. Mounted to the bottom of the heat sink is a lamp die (11) with plurality of lamp sources (1). Over the plurality of lamp sources (1), nano optics lens (9) is used to provide a narrow light dispersion pattern across the embodiment's long axis. This and other optical patterns can be used interchangeably with the heat sink for both up and down lighting. Other elements include the lamp's pin(s) (17), the lamp rotation device (19), the lamp's driver or driver and other devices enclosure (18), and the heat sink's fins (13).

FIGS. 5a, 5b and 5c show elevations of the heat sink with integral fins perpendicular to the long axis of the embodiment and single or bi-directional lamp module(s).

FIG. 5a shows the top elevation of the heat sink's embodiment. The heat sink's fins' (13) orientation is perpendicular to the embodiment's long axis with fluorescent lamp holder end caps pin receptacle (17) enclosing both ends of the heat sink embodiment. In other embodiments, other electrical or electrical and data means of connectivity can be used. In embodiments where the vertical alignment of the single or bi-directional lamp source (1) is difficult and/or the lamp position cannot be sustained, a lamp rotation device (19) insures proper positioning. This rotation alignment device is explained in more detail in FIGS. 8 and 9. On top of the heat sink, the lamp die (11) with plurality of lamp sources (1) extend from one end of the heat sink to the other. The light source (1) is encased by a clear or frosted lamp lens (8) typically having a wide light dispersion pattern.

FIG. 5b shows the side elevation of the heat sink (10). The other side's elevation typically mirrors this elevation. Elements shown in this elevation include the end caps' lamp pin(s) (17), the lamp rotation device (19), and the heat sink's integral fins (13). These fins are perpendicular to the embodiment's main axis exposing the heat sink (10) to maximum air flow coverage with cool air rising from below and travelling through and in between the fins to above.

FIG. 5c shows the bottom elevation of the heat sink with single or bi-directional lamp sources. Mounted to the bottom of the heat sink is a lamp die (11) with plurality of lamp sources (1). Over the plurality of lamp sources (1), nano optics lens (9) is used to provide a narrow light dispersion pattern across the embodiment's long axis. This and other optical patterns can be used interchangeably with the heat sink for both up and down lighting. Other elements include the lamp's pin(s) (17), the lamp rotation device (19), and the heat sink's fins (13).

Figure 6A:
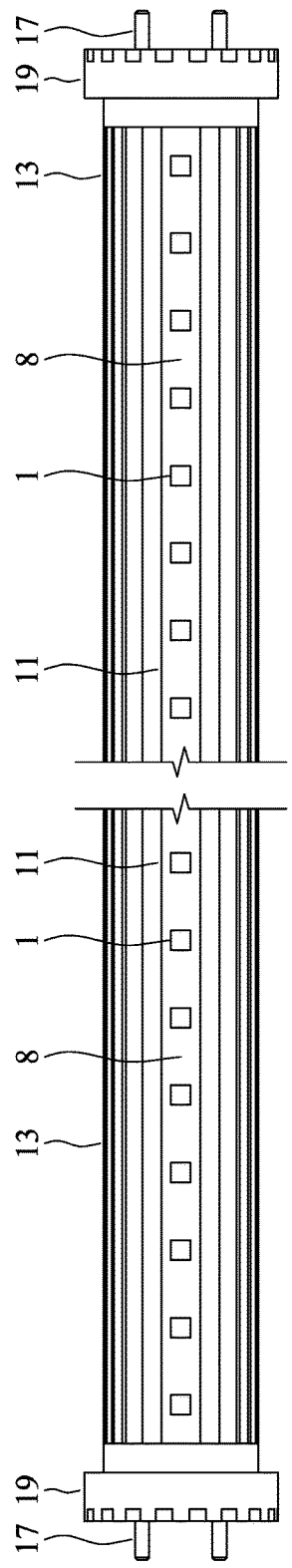
FIG. 6A is a top view of the heat sink with single or bi-directional lamps embodiment and heat-dissipating fins parallel to the long axis according to an embodiment.
Figure 6B:
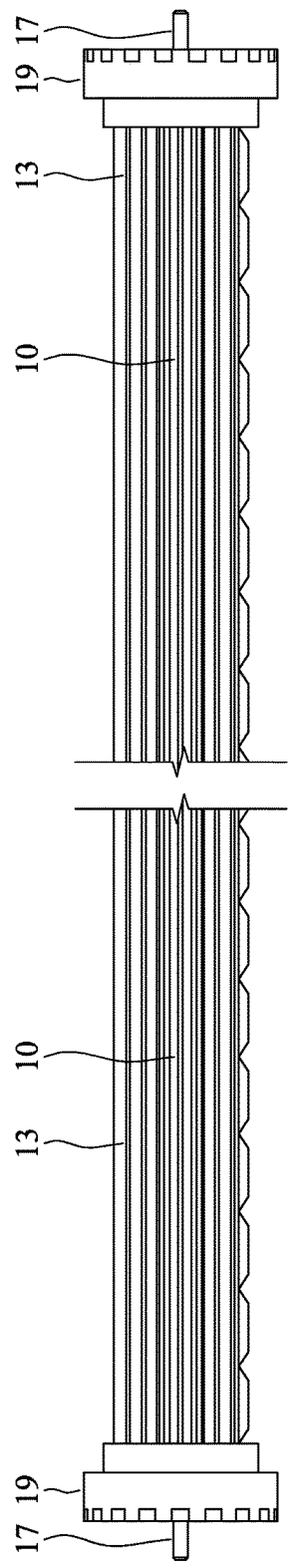
FIG. 6B is a side view of the heat sink with single or bi-directional lamps embodiment and heat-dissipating fins parallel to the long axis according to an embodiment.
Figure 6C:
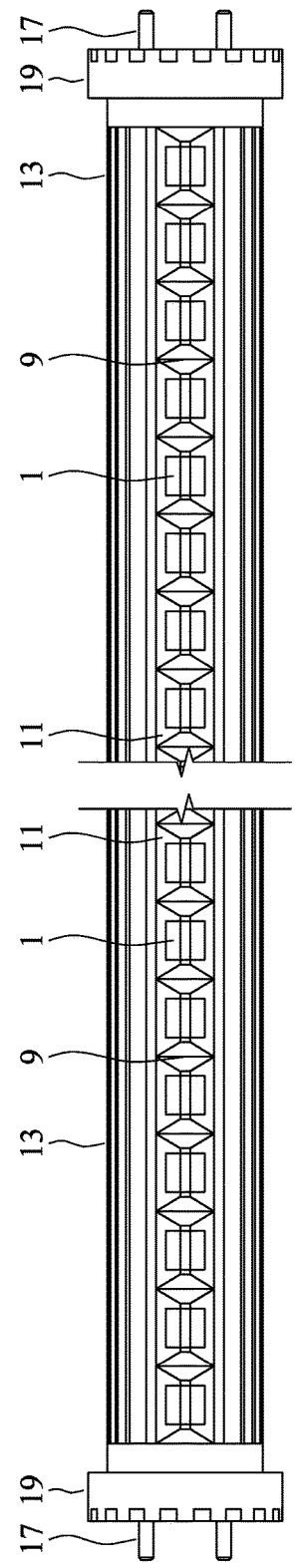
FIG. 6C is a bottom view of the heat sink with single or bi-directional lamps embodiment and heat-dissipating fins parallel to the long axis according to an embodiment.

FIGS. 6a, 6b and 6c show elevations of the heat sink with integral fins parallel to the long axis of the embodiment and single or bi-directional lamp module(s).

FIG. 6a shows the top elevation of the heat sink's embodiment. The heat sink's fins' (13) are parallel to the embodiment's long axis with fluorescent lamp holder end caps pin receptacle (17) enclosing both ends of the heat sink embodiment. In other embodiments, other electrical or electrical and data means of connectivity can be used. In embodiments where the vertical alignment of the single or bi-directional lamp source (1) is difficult and/or the lamp position cannot be sustained, a lamp rotation device (19) insures proper positioning. This rotation alignment device is explained in more detail in FIGS. 8 and 9. On top of the heat sink, the lamp die (11) with plurality of lamp sources (1) extend from one end of the heat sink to the other. The light source (1) is encased by a clear or frosted lamp lens (8) typically having a wide light dispersion pattern.

FIG. 6b shows the side elevation of the heat sink (10). The other side's elevation typically mirrors this elevation. Elements shown in this elevation include the end caps' lamp pin(s) (17), the lamp rotation device (19) and the heat sink's integral fins (13). These fins are parallel to the embodiment's main axis exposing the heat sink (10) and the fins to the surrounding air.

FIG. 6c shows the bottom elevation of the heat sink with single or bi-directional lamp sources. Mounted to the bottom of the heat sink is a lamp die (11) with plurality of lamp sources (1). Over the plurality of lamp sources (1), nano optics lens (9) is used to provide a narrow light dispersion pattern across the embodiment's long axis. This and other optical patterns can be used interchangeably with the heat sink for both up and down lighting. Other elements include the lamp's pin(s) (17), the lamp rotation device (19) and the heat sink's fins (13).

FIGS. 7a, 7b, 7c, 7d, 7e and 7f show partial elevations of the heat sink with single or bi-directional lamp module employing conventional fluorescent end cap receptacles. The end cap receptacles used can conform to all industry standards accommodating for the use of any fluorescent lamp type or can be custom made. In another embodiment, an integral driver and other power consuming devices can be placed between an end cap receptacle and the heat sink's body.

FIGS. 7a, 7b and 7c show the top (7a), side (7b) and bottom (7c) of the heat sink embodiment having perpendicular fins to the embodiment's long axis and a conventional fluorescent end cap receptacle.

FIGS. 7d, 7e and 7f show the top (7d), side (7e) and bottom (7f) of the heat sink embodiment having parallel fins to the embodiment's long axis and a conventional fluorescent end cap receptacle.

Figure 8B:
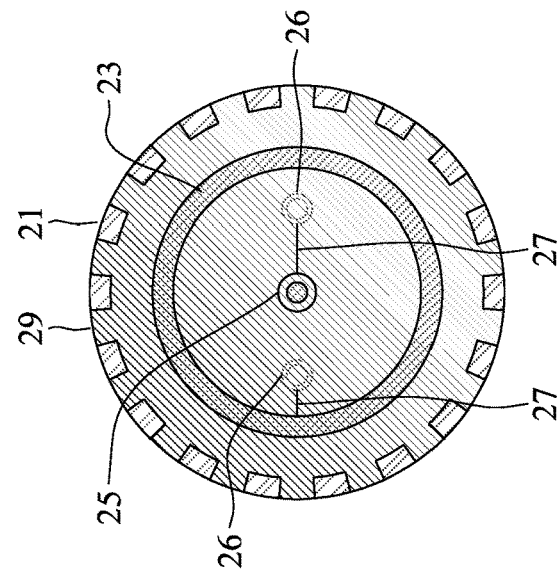
FIG. 8B is an enlarged section view of a lamp's driver or driver and other device(s) enclosure and a section through the end cap receptacle key according to an embodiment.
Figure 8A:
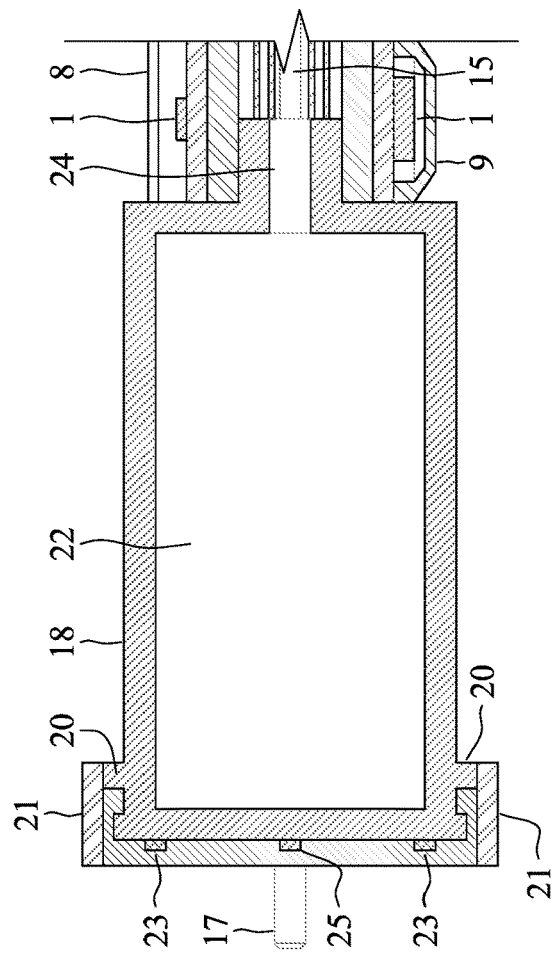
FIG. 8A is an enlarged section view of a lamp's driver or driver and other device(s) enclosure and a section through the end cap receptacle key according to an embodiment.

FIGS. 8a and 8b show the lamp rotation device in a partial longitudinal section and a transverse section. The figures, along with FIG. 9, show means to orient the heat sink's lamp sources. In applications where the light source suspended from the ceiling inside a luminaire and the luminaire retains opening directly above the lamps, proper orientation of the light sources is critical for efficient illumination. In retrofit environment, the existing lamp holders lamp retaining position is unknown. To insure suitable light source orientation, a lamp rotation device is built into the heat sink with light sources assembly. The light source orientation takes place by engaging the assembly in the lamp holder, then pulling inwardly toward the center the rotation device locking hub (21), rotating the lamp assembly for optimal positioning and then locking the rotation device locking hub with keyed openings at the lamp assembly rotation device fixed key (20) and the end cap receptacle key (29).

FIG. 8a is a longitudinal section at the lamp's driver or driver and other devices enclosure (22). Elements shown include the assembly electrical pin(s) (17), power inner contact disk (25), power outer contact disk, rotation device locking hub (21), rotation device fixed key (20), driver bore connector (24), lamp source (1), lens clear or frosted (8), conductors (15) and Nano optics lens (9). The lamp's driver or driver and other devices enclosure (22) with its end cap receptacle (12) connect to the heat sink (10) by inserting the driver bore connector (24) into the bore (16) located inside the heat sink (10). Power or power and data conductors reach the end cap receptacle (12) at the opposite end of the heat sink (10) running through the bore (16).

FIG. 8b is a transverse section through end cap receptacle (12). Elements shown include: power inner connector disk (25), power leads (27), power outer contact disk (23), lamp pins beyond (26), end cap receptacle key (29) and rotation device locking hub (21).

Figure 9C:
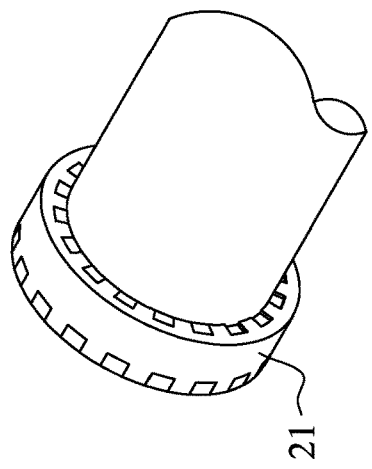
FIG. 9C is a perspective view of an end cap receptacle with the rotation device hub key according to an embodiment.
Figure 9B:
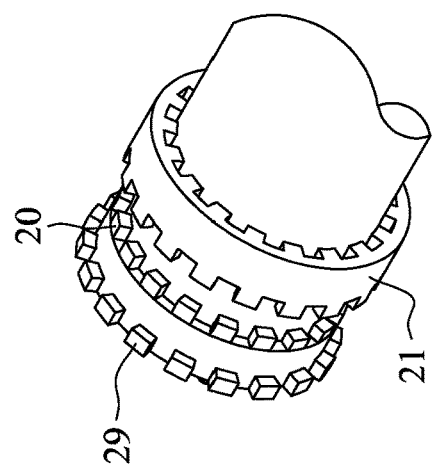
FIG. 9B is a perspective view of an end cap receptacle with the rotation device hub key according to an embodiment.
Figure 9A:
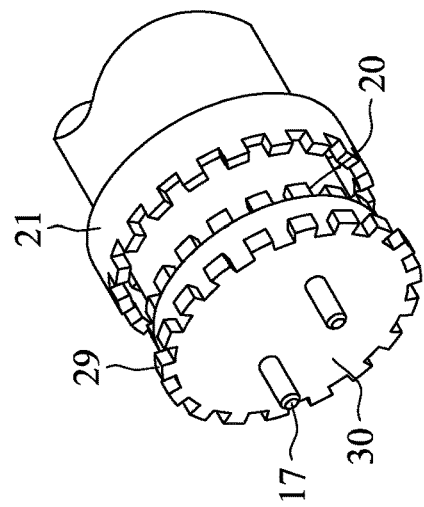
FIG. 9A is a perspective view of an end cap receptacle with the rotation device hub key according to an embodiment.

FIGS. 9a, 9b and 9c show perspective views of the assembly's lamp orientation device.

FIG. 9a shows a perspective of the end cap receptacle exterior elevation (30). Elements shown include assembly's electrical pin(s) (17), end cap receptacle key (29), rotation device fixed key (20) and rotation device locking hub (21). The locking hub (21) is pulled away showing the arrangement in rotation mode.

FIG. 9b shows a perspective from the heat sink's (10) side toward the lamp orientation device (19). Elements shown are: the end cap receptacle key (29), rotation device fixed key (20) and the rotation device locking hub (21). The locking hub (21) is pulled away showing the arrangement in rotation mode.

FIG. 9c shows a perspective from the heat sink's (10) side toward the lamp orientation device (19). In this figure, the lamp orientation device (19) is shown in locked position.

FIGS. 10a, 10c, 10e and 10f show partial views of the heat sink (10) with integral fins (13) extending perpendicularly to the heat sink's long axis.

Figure 10A:
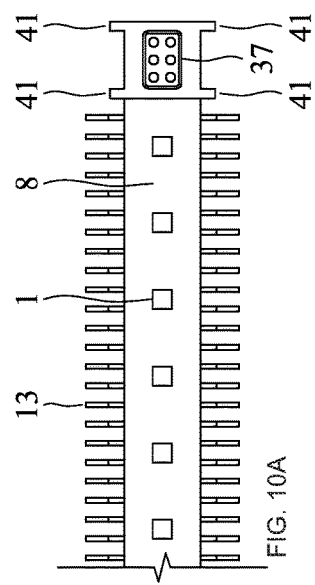
FIG. 10A is a top partial view of the heat sink with heat sink with dedicated retainer housing receptacle according to an embodiment.

FIG. 10a shows the top end view of the heat sink (10) with a power or power and data receptacle (37) and anchoring protrusion (41) extending out from the heat sink (10). Also shown are lamp source and heat-dissipating fins.

Figure 10B:
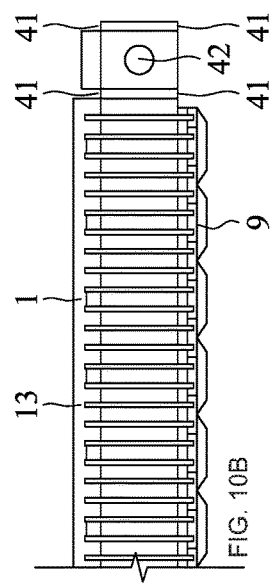
FIG. 10B is a top partial view of the heat sink with heat sink with dedicated retainer housing receptacle coupled in a retainer housing according to an embodiment.
Figure 10C:
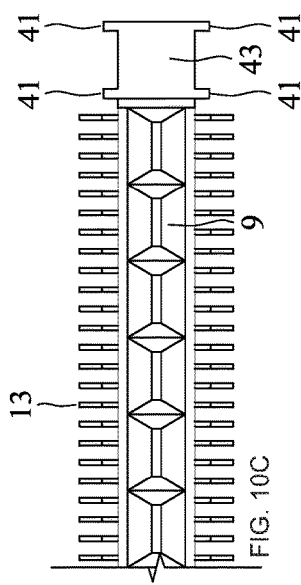
FIG. 10C is a side partial view of the heat sink with heat sink with dedicated retainer housing receptacle according to an embodiment.

FIG. 10c shows the side end view of the heat sink (10) with power or power and data receptacle (37) on top, sink's self-retaining heat sink cavity (42) and anchoring protrusions (41). Also shown are the heat sink (10) fins (13) and light source lenses (8).

FIG. 10 shows the bottom view of the heat sink (10) with the sink's anchoring protrusions (41) and in dash line beyond the self-retaining sink's cavities (42). Also shown are light sources (1) and the heat-dissipating sink fins (13).

Figure 10D:
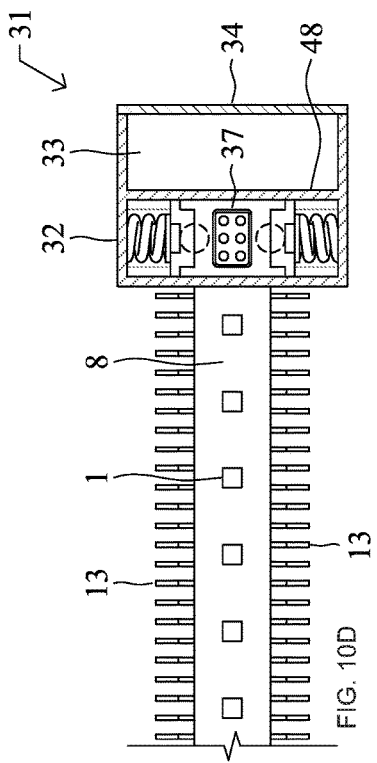
FIG. 10D is a side partial view of the heat sink with heat sink with dedicated retainer housing receptacle coupled in a retainer housing according to an embodiment.
Figure 10E:
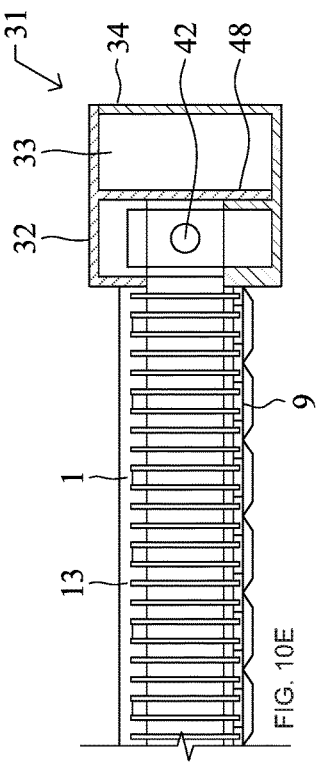
FIG. 10E is a bottom partial view of the heat sink with heat sink with dedicated retainer housing receptacle according to an embodiment.
Figure 10F:
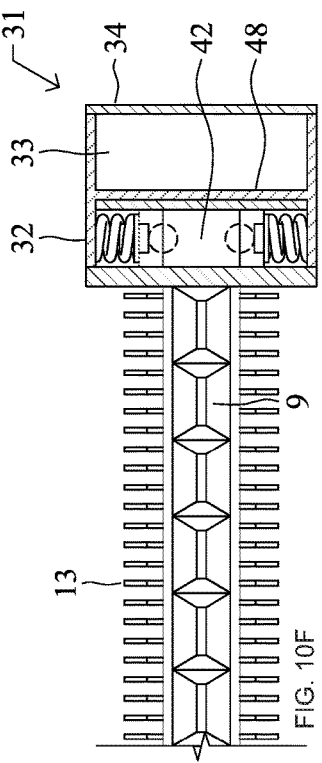
FIG. 10F is a bottom partial view of the heat sink with heat sink with dedicated retainer housing receptacle coupled in a retainer housing according to an embodiment.

FIG. 10e shows the heat sink's (10) end elevation. At its center, the front face of the anchoring protrusion (41) extending outwardly from the sink's core (43). Also extending outwardly on both sides beyond are the heat-dissipating fins (13). Above the core (43) is a power or power and data receptacle (37). At the core's (43) bottom and top surfaces beyond lamp source (1) dies are secured onto the heat sink's (10) core (43) having clear, ??? or optically-controlling lens(es) (8).

FIGS. 10b, 10d and 10g show the heat sink (10) secured inside the retainer housing (31) to form a rigid embodiment. The embodiment can be suspended or secured to the ceiling or wall.

FIG. 10b shows a partial horizontal section of the embodiment above the heat sink (10). At the top of the heat sink's (10) surface, a power or power and data receptacle (37) engage a receiving receptacle (41) mounted to the roof of the retaining housing's body (32). Extending from both sides of the sink's core (43) are anchoring protrusions (41). When slid into position, these protrusions lock the heat sink (10) into position, preventing any rotation or lateral movement between the heat sink (10) and the retaining housing (31). Above and below the heat sink's core (43) drawn in dashed lines are the heat sink's core-retaining cavities. Inside the cavity (42), spring-loaded balls or pins (45) retain the heat sink (10) when the heat sink (10) is pushed upwardly into position. The heat sink (10) can be easily removed when it is pulled downwardly. A J Box (33) on the opposite side of the retaining housing's (31) center wall provides an entry opening for power or power and data (47) and can house electrical devices. The J Box (33) employs a cover (not shown) that slides down, exposing the bottom of the retainer housing (31) a simple side heat sink loading, also the opposite side of the retainer housing (31).

FIG. 10d shows a partial vertical section in front of the heat sink's (10) core side. The heat sink (10) is shown wedged between the retainer housing body (32) above and the J Box cover (34) below. Above the core's upper surface, a receiving receptacle (44) engages the heat sink's power or power and data receptacle (37) (not shown). A circle at the face of the core (43) designated a cavity (42) into which a spring-loaded ball or rounded pin (45) retain the sink (10) in place. Also shown is the J Box (33) opening and in section the anchoring protrusions (41).

FIG. 10g shows a partial horizontal section below the heat sink's (10) bottom face. The heat sink (10) is vertically and horizontally fixed by the heat sink retaining tracks (46) and wedged between the retaining housing body (32) and the J Box cover (34) (not shown). A dash line semi-circle on the heat sink's core (43) designated cavities beyond (42) spring-loaded ball or rounded pins (45) retain the sink in place. Also shown is the J Box (33) opening and in dashed line cover release push buttons (35) (not shown) locations below the section and power or power and data entry opening (47).

Figure 11B:
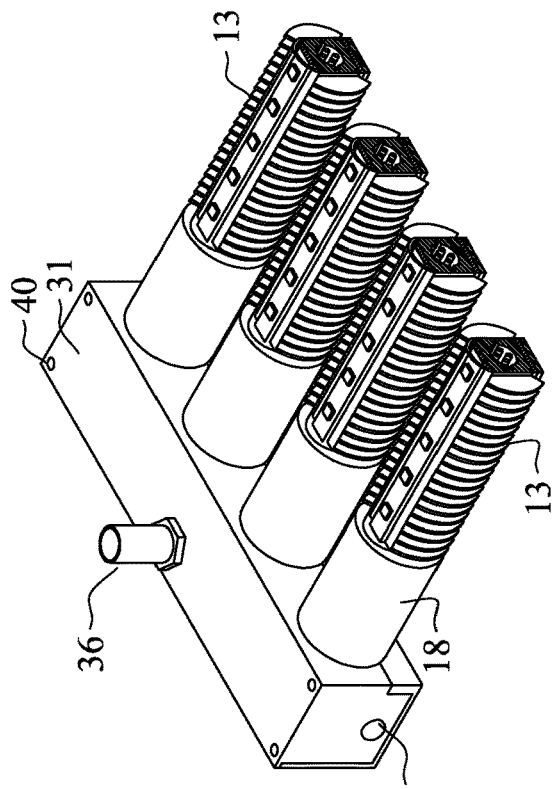
FIG. 11B is another perspective view of a retainer housing retaining four heat sinks according to an embodiment.
Figure 11A:
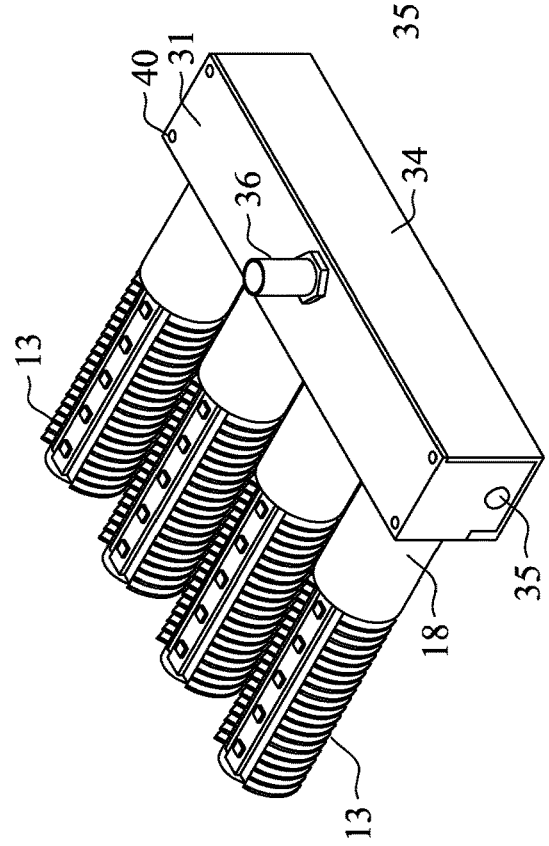
FIG. 11A is a perspective view of retainer housing retaining four heat sinks according to an embodiment.

FIGS. 11a and 11b show perspectives of the retainer housing (31) retaining an assembly of four heat sinks (10). The retainer housing (31) can retain a plurality of heat sinks (10) from a single side or also from both sides. The housing can also be modular to retain the plurality of heat sinks (10) in a continuous row and/or in non-linear configuration (not shown). The retainer housing (31) enclosure is made of two elements, the retainer housing body (32) and the J Box cover (33). The retainer housing body (32) supports the retained heat sink (10) and its own weight being suspended or mounted to the ceiling. Power enters the retainer housing (31) typically from above. Alternate knockout(s) (39) opening can also be placed on the sides of the housing. The J Box cover (34) slides into position from below. The J Box cover (34) is retained by push buttons or similar latching (35) devices at the sides of the retainer housing body (32). The J Box cover (34) can retain a variety of sensing and/or communication devices on its exterior and interior surfaces.

FIG. 11a shows a single side loaded retainer housing with four heat sinks. On top of the housing at both ends, a pair of holes provides mounting points to suspend the embodiment from aircraft cable of a chain. When the embodiment is secured to structure, the holes' openings are used to secure the embodiment to structures using screws or bolts. At the center of the top surface of the retainer housing (31), a knockout opening (39) enables power or power and data to enter the J Box (33). The knockout (39) can also serve as a mounting point to all thread type hanger and to ??? conduit. At the long side wall of the perspective, the J Box cover (34) side wall is shown with its release button/catch (35) shown on the short side wall.

FIG. 11b shows the same perspective to FIG. 11a in the opposite direction. This view shows the union between the retainer housing (31) and the J Box cover (34) with the heat sinks (10) wedged between these two elements.

FIGS. 12a and 12b show an enlarged section of the retainer housing (31).

FIG. 12a shows a transverse section with the J Box cover (34) engaged to the retainer housing body (32). Power or power and data enter the J Box (33) inside ridged conduit (36) mounted to the retainer housing's (31) top surface. The heat sink (10) mates with the retainer housing (31) at the sink's core port (38) with electrical receptacle (37) shown above. In dashed line below is the J Box cover (34) release button/latch (35) beyond.

FIG. 12b shows a longitudinal section through a four heat sinks retainer single sided housing embodiment. In other embodiments a modular assembly can be double sided forming a linear row/s or non-linear configuration (not shown). At the short ends of the housing on the exterior surface release button/latch (35) are shown inside the housing and above its center housing division wall (48) is the J Box cover (34) with the removable J Box cover (34) shown at the exterior long wall and the floor of the housing (31). At the heat sink core port (38) side, each port employs heat sink retaining tracks (46) on both sides to lock in place the heat sink core (43) anchoring protrusions (41). Power or power and data enters the J Box (33) and from there through opening(s) in the housing division wall (48) reach the receiving receptacle(s) (44) (not shown).

Figures 13A, 13B:
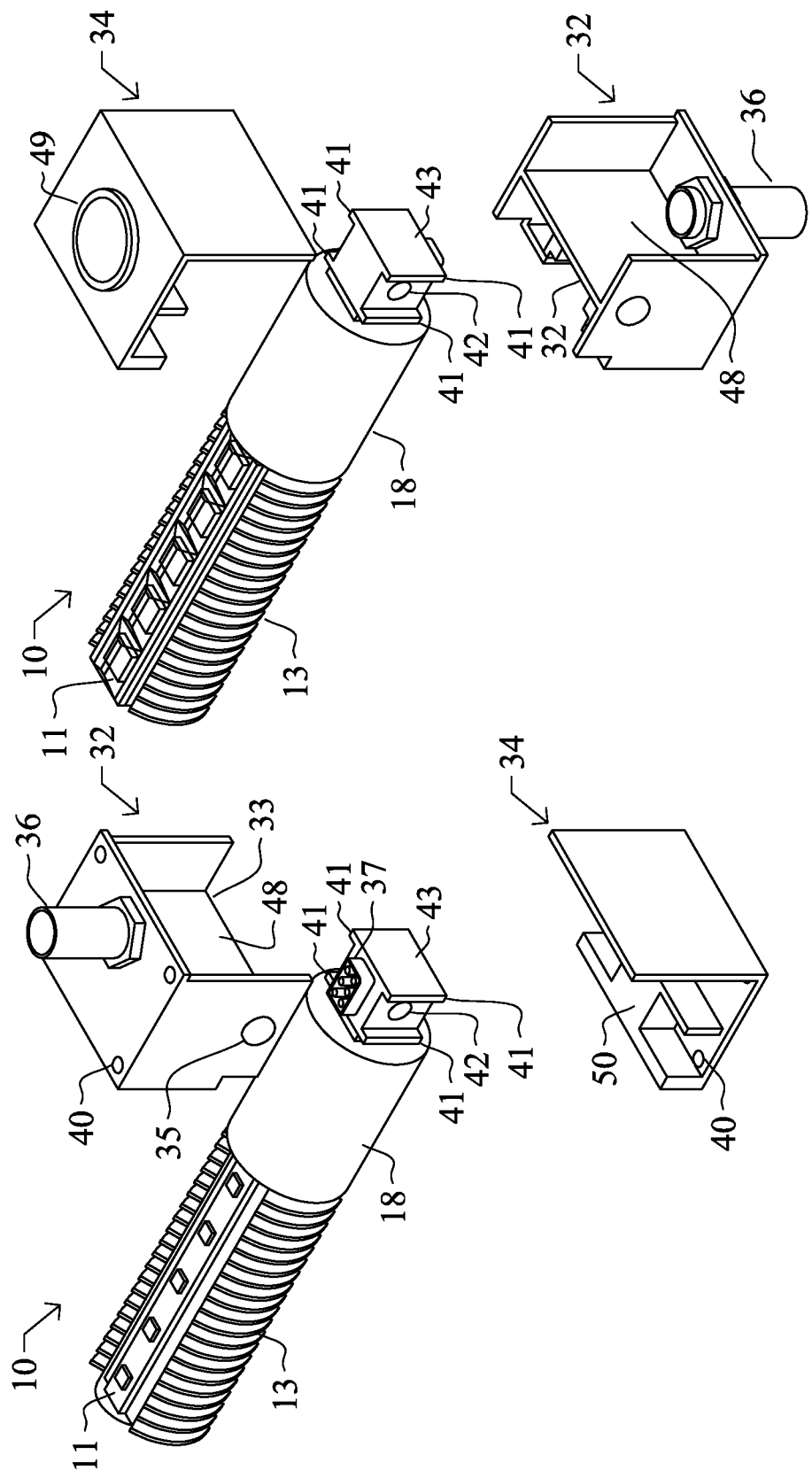
FIG. 13A is a top exploded perspective view a retainer housing and heat sink according to an embodiment.

FIG. 13a shows a top view of an exploded perspective of the retaining housing (31) embodiment. On top, the retaining housing body (32) is shown connected to a rigid conduit (36). Also shown on top of the housing opening are a pair of holes to mount a suspension cable or chain from. Wedged in between the top and bottom elements is the heat sink (10) embodiment with integral driver. At the heatsink core (43) shows a power or power and data receptacle (37) and anchoring protrusions (41) to anchor the sink (10) in the heatsink retaining track (not shown). The J Box cover (34) is shown in the bottom. This element encloses the J Box (33)

and retains the sink (10) secured in place. Features shown include on the side a release button/latch (35), at the bottom an occupancy sensor/daylight harvester (49) and inside the cover a sink retaining plunger (50) securing the sink in place from the bottom.

FIG. 13b shows a bottom view of an exploded perspective of the retaining housing (31) embodiment. On top, the J Box cover (34) is shown with a release button/latch (35) on its side. Wedged in the center is the heat sink's (10) bottom-facing side. At the sink's core (43) wall between the anchoring protrusions (41), a self-retaining heatsink cavity (42) shown retains a spring-loaded ball or pin (45) that retains the heat sink (10) in place when pushed upwardly. The retaining housing body (32) is shown with a rigid conduit (36) mounted to its bottom face. Inside the housing separated by the housing division wall (48) are the J Box (33) and the heatsink retaining tracks (46) securing the heat sink (10) in place and the receiving receptacle (44) providing power or power and data to the heat sink (10).

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A heat sink assembly comprising:
    a single substantially solid or solid core detachable linear heat sink having at least two exterior flat surfaces;
    a plurality of external heat dissipating fins; and
    a plurality of light sources retained on the at least two exterior flat surfaces of the core, wherein:
    the plurality of external heat dissipating fins and the heat sink are a unitary body with the plurality of external heat dissipating fins extending outwardly and from a surface positioned substantially perpendicular to the at least one exterior flat surface of the heat sink;
    heat generated by the plurality of light sources is substantially transferred to the heat sink and then substantially dissipated through the plurality of heat dissipating fins;
    the heat sink and the plurality of heat dissipating fins are surrounded by free-flowing air; and
    a length of a maximum dimension of the core and one fin is greater than a length of a dimension of the core taken perpendicular to said at least one exterior flat surface, wherein light is emitted from the at least two exterior flat surfaces in opposite directions from the core.

2. The assembly of claim 1, wherein each surface of the heat sink retaining light sources can operate independently of each other.

3. The assembly of claim 2, further comprising at least one integral driver.

4. The assembly of claim 1, wherein the heat sink and plurality of fins are made of metallic material, non-metallic material, or combinations thereof.

5. The assembly of claim 1, wherein at least one lamp source's natural light dispersion is augmented by an optically altering device.

6. The assembly of claim 1, wherein a lamp holder(s) is/are configured to retain the heat sink in a dedicated position relating to the light source orientation.

7. The heat sink of claim 1, wherein an orientation device coupled to the heat sink rotates transversely to its linear axis when the heat sink receptacle is engaged.

8. The assembly of claim 1, wherein the heat sink's lamp can transmit data photonically.

9. The assembly of claim 1, wherein the heat sink may retain electronic devices including light source and other power-consuming devices.

10. The assembly of claim 1, wherein a sensing device mounted or built into the heat sink communicates with remote devices.

11. The linear heat sink of claim 1, further comprising conductors inside a longitudinal bore in the core of the heat sink to convey power or power and data.

12. A heat sink assembly comprising
    a single substantially solid or solid core detachable heat sink, a plurality of external heat dissipating fins, a plurality of light sources and at least one electromechanical connector;
    the plurality of light sources retained on at least two exterior flat surfaces of the core, wherein:
    the plurality of external heat dissipating fins and the heat sink are a unitary body with the plurality of external heat dissipating fins extending outwardly and from a surface positioned substantially perpendicular to the at least one exterior flat surface of the heat sink;
    heat generated by the plurality of light sources is substantially transferred to the heat sink and then substantially dissipated through the plurality of heat dissipating fins;
    the heat sink and the plurality of heat dissipating fins are surrounded by free-flowing air;
    a length of a maximum dimension of the core and one fin is greater than a length of a dimension of the core taken perpendicular to said at least one exterior flat surface; and
    the at least one mechanical connector mechanically retains the heat sink and provides electrical or electrical and data connectivity, wherein light is emitted from the at least two exterior flat surfaces in opposite directions from the core.

13. The heat sink of claim 12, wherein each surface of the heat sink retaining light sources can operate independently of each other.

14. The heat sink of claim 12, further comprising at least one integral driver.

15. The heat sink of claim 12, wherein a connector of the heat sink coupled to a retaining housing forms a rigid connection.

16. The heat sink of claim 12, wherein at least one light source's natural light dispersion is augmented by an optically altering device.

17. The heat sink of claim 12, wherein an orientation device coupled to the heat sink can rotate transversely to its linear axis when the heat sink receptacle is engaged.

18. The heat sink of claim 12, wherein a lamp of the heat sink transmits data photonically.

19. The heat sink of claim 12, wherein the heat sink retains electronic devices including light source and communication devices.

20. The heat sink of claim 12, wherein a sensing device mounted to or built into the heat sink communicates with remote device(s).

21. A heat sink light comprising:
a single substantially solid or solid core detachable linear heat sink having at least two exterior flat surfaces;
a plurality of light sources retained on the at least two exterior flat surfaces of the heat sink; and
the plurality of external heat dissipating fins and the heat sink are a unitary body with the plurality of external heat dissipating fins extending outwardly and from a surface positioned substantially perpendicular to the at least one exterior flat surface of the heat sink; wherein:
the heat sink and the plurality of heat dissipating fins are surrounded by free-flowing air;
a length of a maximum dimension of the core and one fin is greater than a length of a dimension of the core taken perpendicular to said at least one exterior flat surface; and
the detachable heat sink rotates transversely about a longitudinal center axis and is coupled to at least one mechanical or electromechanical connector, wherein light is emitted from the at least two exterior flat surfaces in opposite directions from the core.

22. The heat sink of claim 21, wherein the mechanical or electromechanical connector of the heat sink is coupled to a mechanical or electromechanical connector in the retainer housing wherein the housing retains at least one of driver, sensing and/or communication device.

23. The heat sink of claim 21, wherein the heat sink and the retainer housing each have at least one of driver, sensing and/or communication device.

24. The heat sink of claim 21, wherein the retainer housing is made of metallic material, nonmetallic material, or metallic and nonmetallic material.

25. The heat sink of claim 21, wherein at least one connector of the heat sink mechanically engages a receptacle in the retainer housing forming a rigid keyed connection through which power or power and data flow.

26. The heat sink of claim 25, wherein at least two heat sinks are retained by a single retainer housing and the at least two heat sinks engage receptacles located in other than the same side of the retainer housing.

* * * * *